United States Patent [19]
Ryoho et al.

[11] Patent Number: 5,708,615
[45] Date of Patent: Jan. 13, 1998

[54] SEMICONDUCTOR MEMORY DEVICE WITH REDUCED CURRENT CONSUMPTION DURING PRECHARGE AND READING PERIODS

[75] Inventors: Fumihiro Ryoho; Hiroaki Kanno, both of Tokyo, Japan

[73] Assignees: Mitsubishi Denki Kabushiki Kaisha; Mitsubishi Electric Engineering Co., Ltd., both of Tokyo, Japan

[21] Appl. No.: 708,733

[22] Filed: Sep. 5, 1996

[30] Foreign Application Priority Data

Jan. 30, 1996 [JP] Japan .................... 8-013796

[51] Int. Cl.[6] .................... G11C 7/00
[52] U.S. Cl. .................... 365/203; 365/189.02; 365/227; 365/230.04
[58] Field of Search .................... 365/203, 230.04, 365/189.02, 226, 189.01, 227

[56] References Cited

U.S. PATENT DOCUMENTS 5,040,148 8/1991 Nakai et al. .................... 365/207
5,331,600 7/1994 Higuchi .................... 365/230.04

Primary Examiner—David C. Nelms
Assistant Examiner—F. Niranjan
Attorney, Agent, or Firm—Oblon, Spivak, McClelland, Maier & Neustadt, P.C.

[57] ABSTRACT

A semiconductor memory device with low current consumption is disclosed. A bit line selecting circuit (3) establishes electrical connection between a bit line (BL) selected during a read period and a node (N2) in response to bit line connection/selection signals (SB0 to SB4). A charge-up circuit (7) includes PMOS transistors (Q29, Q30). The PMOS transistor (Q29) has a source connected to a power supply ($V_{DD}$), a drain connected to a drain of a transistor (Q10) of the bit line selecting circuit (3), and a gate receiving a read control signal (SC). The PMOS transistor (Q30) has a source connected to the power supply ($V_{DD}$), a drain connected to the drain of the transistor (Q10) of the bit line selecting circuit (3), and a gate fixed at a ground level.

7 Claims, 9 Drawing Sheets

SEMICONDUCTOR MEMORY DEVICE WITH REDUCED CURRENT CONSUMPTION DURING PRECHARGE AND READING PERIODS

BACKGROUND OF THE INVENTION

1. Field of the Invention

The present invention relates to a semiconductor memory device which operates with low current consumption.

2. Description of the Background Art

In recent years, the increasing use of portable equipments, typically mobile PCs and portable telephones, has created a need for microcomputers for use in the equipments to operate at high speeds with minimum power consumption as well as a need for size reduction of packages of the microcomputers. Such techniques for low-voltage high-speed operation and low power consumption have been a significant technical consideration.

FIG. 7 schematically illustrates a circuit arrangement of a conventional semiconductor memory device. As shown, memory elements 1 are arranged in a matrix (showing only two rows and four columns in FIG. 7). Each column of the memory elements 1 are connected to a bit line BL (BL1 to BL4), and each row thereof is connected to a word line WL (WL1 and WL2).

The bit lines BL1 to BL4 are connected to charge-up circuits 2, respectively. The charge-up circuits 2 accumulate electric charges (referred to hereinafter as "charge up") on the corresponding bit lines BL to cause the bit lines BL to hold the electric charges.

The bit lines BL1 to BL4 are connected commonly to a bit line selecting circuit 3. The bit line selecting circuit 3 receives a bit line connection/selection signal SB (SB0 to SB4) to control the selection of the bit lines BL1 to BL4 in response to the bit line connection/selection signal SB. The selection of the word lines WL1 and WL2 is controlled by a word line selection signal SW (SW1 and SW2) from a signal generator 6.

The signal generator 6 outputs a read control signal SC, the bit line connection/selection signal SB, and the word line selection signal SW under control of a read signal READ from a CPU 5.

The bit line selecting circuit 3 applies to an output amplifying circuit 4 an output signal S3 which is the data (data in electric form such as potential, electric charge amount, and the like) stored in the selected memory element 1 on the bit line BL selected during read operation.

The output amplifying circuit 4 receives the read control signal SC to amplify the output from the bit line selecting circuit 3 under control of the read control signal SC to provide an output signal S4 to the exterior.

FIG. 8 is a circuit diagram showing the circuit arrangement of FIG. 7 in detail. As shown, each memory element 1 includes one NMOS memory transistor QM having a drain connected to the corresponding bit line BL, a gate connected to the corresponding word line WL, and a source grounded. The memory transistor QM turns on/off in response to the data stored therein which is "1"/"0" when the corresponding word line WL is "H".

Each charge-up circuit 2 includes a PMOS transistor Q40 having a source connected to a power supply $V_{DD}$, a drain connected to the corresponding bit line BL, and a gate receiving the read control signal SC.

The bit line selecting circuit 3 includes NMOS transistors Q10 to Q14. The transistor Q10 has a gate receiving the bit line connection signal SB0, and a source connected commonly to the drains of the transistors Q11 to Q14. The transistors Q11 to Q14 have gates receiving the bit line selection signals SB1 to SB4, and sources connected to the bit lines BL1 to BL4, respectively. A signal from the drain of the transistor Q10 is applied as the output signal S3 to the output amplifying circuit 4.

The output amplifying circuit 4 comprises inverters 21, 22, PMOS transistors Q21, Q22, Q24, Q27, and NMOS transistors Q23, Q25, Q26, Q28.

The transistors Q21 to Q23 are connected in series between the power supply $V_{DD}$ and the ground. The transistor Q21 has a gate receiving the read control signal SC. The inverter 22 inverts the read control signal SC to apply the inverted control signal $\overline{SC}$ to the gates of the transistors Q22 and Q23.

The transistors Q24 to Q26 are connected in series between the power supply $V_{DD}$ and the ground. The inverter 21 inverts the output signal S3 to apply the inverted output signal $\overline{S3}$ to the gates of the transistors Q24 and Q26. The transistor Q25 has a gate receiving the read control signal SC.

The transistors Q27 and Q28 are connected in series between the power supply $V_{DD}$ and the ground. The gate of the transistor Q27 is connected to the drain of the transistor Q21 and the drain of the transistor Q24. The gate of the transistor Q28 is connected to the drain of the transistor Q23 and the drain of the transistor Q26.

The output signal S4 is provided at a node N1 connected to the drains of the transistors Q27 and Q28.

FIG. 9 is a timing chart showing the read operation of the semiconductor memory device of FIGS. 7 and 8. The operation will be discussed below with reference to FIG. 9. For purposes of illustration, it is assumed that the memory element 1 connected to the word line WL1 and the bit line BL1 (the shaded memory element 1' of FIGS. 7 and 8) is selected.

Referring to FIG. 9, during a precharge period over which the read signal READ is "H", the read control signal SC is at the potential level "L", and the charge-up circuits 2 are active to charge up all of the bit lines BL (BL1 to BL4) to the potential level "H" (referred to simply as "H" hereinafter).

Then, during a read period after the read signal READ falls to "L", the read control signal SC changes to "H" to shift the operation of the charge-up circuits 2 from the charge-up operation to a bit line potential holding operation.

The bit line selecting circuit 3 selects one bit line BL1 among the bit lines BL1 to BL4 connected to the bit line selecting circuit 3 in response to the bit line connection/selection signals SB0 to SB4 which are "H", "H", "L", "L", "L", respectively. Then, the word line WL1 is selected by the word line selection signals SW1 and SW2 which are "H", "L", respectively.

As a result, selected is the memory element 1' determined uniquely by the bit line BL1 previously selected by the bit line selecting circuit 3 and the selected word line WL1. The data stored in the selected memory element 1' controls the potential of the output signal S3 from the bit line selecting circuit 3. Specifically, if the data stored in the selected memory element 1' is "1", the memory transistor QM is in the ON position and, accordingly, the electric charge held by the memory element 1' is equivalent to "0" (grounded). The potential level of the selected bit line BL1 changes from "H" during the charge-up operation to "L".

If the data stored in the memory element 1' is "0", the electric charge held by the memory element 1' is not "0" (equivalent to a disconnected state). Then, the potential level of the bit line BL1 does not change but remains "H" to which it has been set during the precharge period.

In this manner, the potential level of the bit line BL1 is fixed at "H" or "L" during the read period. That is, the potential of the bit line BL charged up once prior to the read period is changed or unchanged depending on the data stored in the selected memory element 1. Thus, the changes in this potential or electric charge may be applied as the output signal S3 to the output amplifying circuit 4 and amplified by the output amplifying circuit 4, permitting the data stored in the selected memory element 1 to be used as a logic value (the output signal S4 from the output amplifying circuit 4).

As above stated, the conventional semiconductor memory device is designed to charge up all of the bit lines BL1 to BL4 once prior to the reading of data. For the above described read operation, for example, the bit lines BL2 to BL4 which are not originally required for the read operation are charged up, resulting in wasteful current consumption.

SUMMARY OF THE INVENTION

A first aspect of the present invention is intended for a semiconductor memory device having a plurality of memory cells wherein a precharge period is established prior to a read period. According to the present invention, the semiconductor memory device comprises: a plurality of bit lines each connected to at least one of the plurality of memory cells; bit line selecting means between the plurality of bit lines and a connection node for selecting one of the plurality of bit lines as a selected bit line to establish electrical connection between the selected bit line and the connection node during the precharge period and the read period; precharge means for applying a precharge voltage to the connection node; and output means for providing an output signal in response to a signal at the connection node, the precharge means including a first transistor having a first electrode receiving the precharge voltage, a second electrode connected to the connection node, and a control electrode receiving a fixed voltage indicative of a normally-on state.

Preferably, according to a second aspect of the present invention, the precharge means further comprises a second transistor having a first electrode receiving the precharge voltage, a second electrode connected to the connection node, and a control electrode receiving a control voltage indicative of an on-state during the precharge period.

In accordance with the semiconductor memory device of the first aspect of the present invention, the bit line selecting means selects one of the plurality of bit lines as the selected bit line to establish electrical connection between the selected bit line and the connection node receiving the precharge voltage during the precharge period and read period. Thus, current flows only through the selected bit line during the precharge and read periods, accordingly permitting the operation with low power consumption.

The first transistor of the precharge means has the first electrode receiving the precharge voltage, the second electrode connected to the connection node, and the control electrode receiving the fixed voltage indicative of the normally-on state. During the read period, the precharge voltage is provided from the second electrode of the first transistor. Thus, the potential at the connection node may be maintained at a potential close to the precharge voltage if the potential of the selected bit line does not change during the read period.

The result is the stable read operation if the precharge voltage is relatively low.

In accordance with the semiconductor memory device of the second aspect of the present invention, the precharge means further includes the second transistor having the first electrode receiving the precharge voltage, the second electrode connected to the connection node, and the control electrode receiving the control voltage. Since the control voltage indicates the on-state during the precharge period, the first and second transistors reliably precharge the selected bit line at the precharge voltage during the precharge period.

It is therefore an object of the present invention to provide a semiconductor memory device with minimum current consumption.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Preferred Embodiment>

Figure 1:
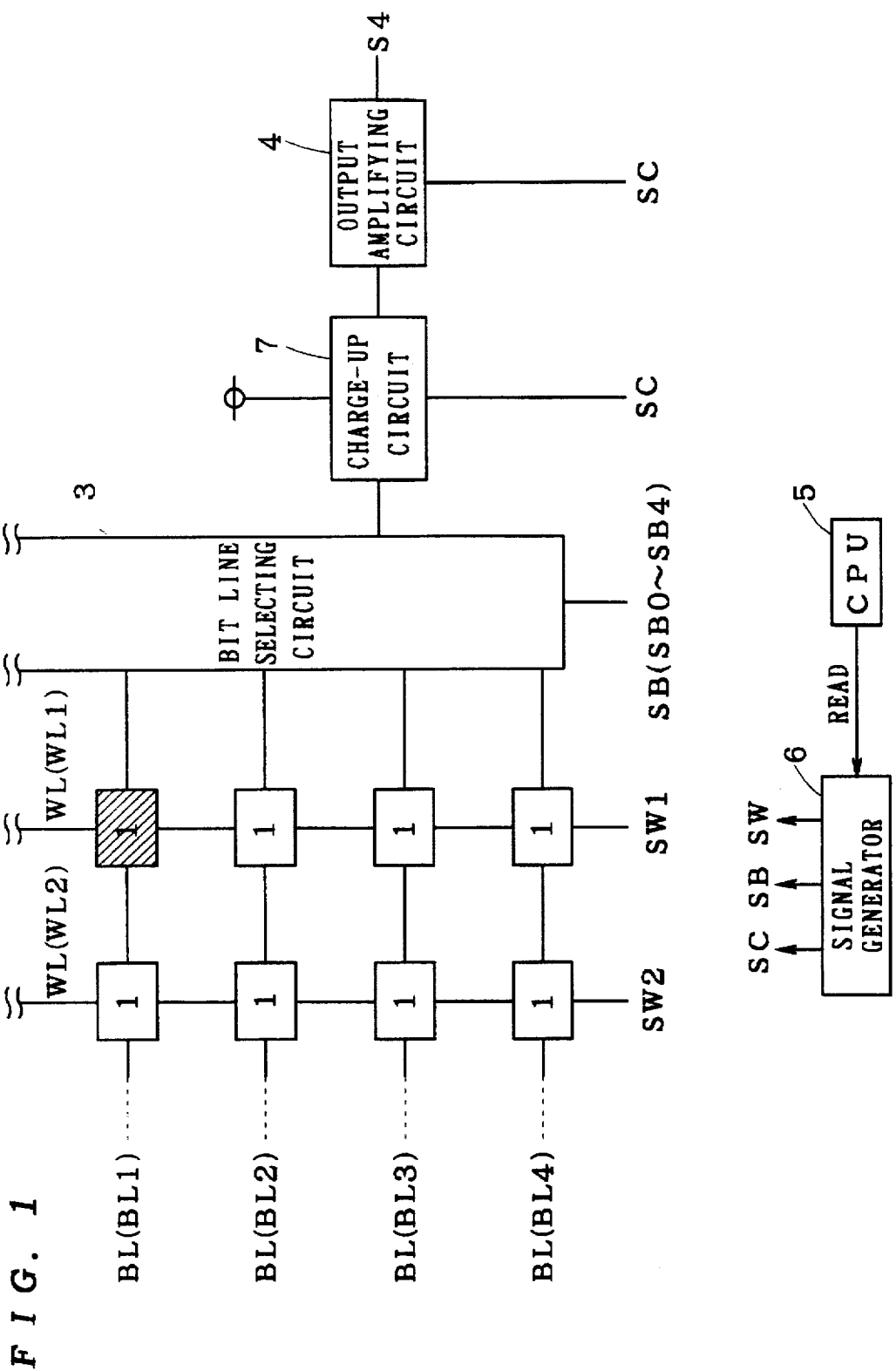
FIG. 1 illustrates the construction of a semiconductor memory device according to a first preferred embodiment of the present invention.

FIG. 1 schematically illustrates a circuit arrangement of a semiconductor memory device according to a first preferred embodiment of the present invention. As shown in FIG. 1, memory elements 1 are arranged in a matrix (showing only two rows and four columns in FIG. 1). Each column of the memory elements 1 is connected to a bit line BL (BL1 to BL4), and each row thereof is connected to a word line WL (WL1 and WL2).

The bit lines BL1 to BL4 are connected commonly to a bit line selecting circuit 3. The bit line selecting circuit 3 receives a bit line connection/selection signal SB (SB0 to SB4) to control the selection of the bit lines BL1 to BL4 in response to the bit line connection/selection signal SB. The selection of the word lines WL1 and WL2 is controlled by a word line selection signal SW (SW1, SW2) outputted from a signal generator 6.

The bit line selecting circuit 3 is connected to a charge-up (precharge) circuit 7. The charge-up circuit 7 accumulates electric charges on the bit line BL selected by the bit line selecting circuit 3 to cause the selected bit line BL to hold the electric charges.

The signal generator 6 outputs a read control signal SC, the bit line connection/selection signal SB, and the word line selection signal SW under control of a read signal READ from an CPU 5.

The bit line selecting circuit 3 applies to an output amplifying circuit 4 an output signal S3 (not shown in FIG. 1) which is data (data in electrical form such as potential, electric charge amount, and the like) stored in the selected memory element 1 on the bit line BL selected during read operation, as will be described in detail later.

The output amplifying circuit 4 receives the read control signal SC to amplify the output from the bit line selecting circuit 3 under control of the read control signal SC to provide an output signal S4 to the exterior.

Figure 2:
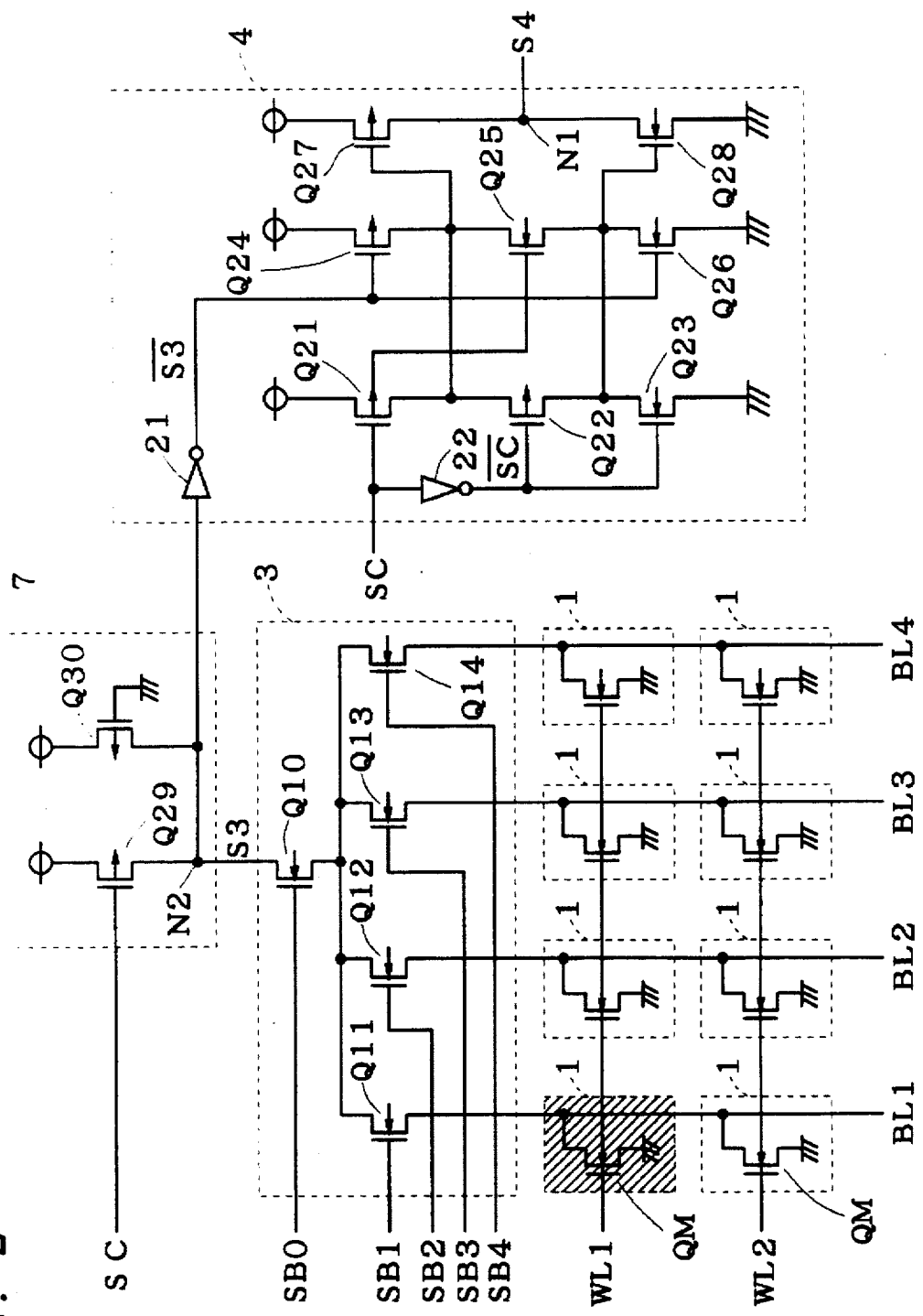
FIG. 2 is a circuit diagram showing the details of FIG. 1.

FIG. 2 is a circuit diagram showing the circuit arrangement of FIG. 1 in detail. As shown, each memory element 1 includes one NMOS memory transistor QM having a drain connected to the corresponding bit line BL, a gate connected to the corresponding word line WL, and a source grounded. The memory transistor QM stores information indicative of "0"/"1" in response to a threshold voltage which is high/low. If the corresponding word line WL is "H", the memory transistor QM turns on/off in response to the data stored therein which is "1"/"0".

The bit line selecting circuit 3 includes NMOS transistors Q10 to Q14. The transistor Q10 has a gate receiving the bit line connection signal SB0, and a source connected commonly to the drains of the transistors Q11 to Q14. The transistors Q11 to Q14 have gates receiving the bit line selection signals SB1 to SB4, and sources connected to the bit lines BL1 to BL4, respectively. A signal from the drain of the transistor Q10 is applied as the output signal S3 to the output amplifying circuit 4. It should be noted that the transistors Q10 to Q14 have the same threshold voltage VTN.

The charge-up circuit 7 includes PMOS transistors Q29 and Q30. The PMOS transistor Q29 has a source connected to a power supply $V_{DD}$, a drain connected to the drain of the transistor Q10 of the bit line selecting circuit 3, and a gate receiving the read control signal SC. The transistor Q30 has a source connected to the power supply $V_{DD}$, a drain connected to the drain of the transistor Q10 of the bit line selecting circuit 3, and a gate fixed at a ground level.

The output amplifying circuit 4 comprises inverters 21, 22, PMOS transistors Q21, Q22, Q24, Q27, and NMOS transistors Q23, Q25, Q26, Q28.

The transistors Q21 to Q23 are connected in series between the power supply $V_{DD}$ and the ground. The gate of the transistor Q21 receives the read control signal SC. The inverter 22 inverts the read control signal SC to apply the inverted control signal $\overline{SC}$ to the gates of the transistors Q22 and Q23.

The transistors Q24 to Q26 are connected in series between the power supply $V_{DD}$ and the ground. The inverter 21 inverts the output signal S3 to apply the inverted output signal $\overline{S3}$ to the gates of the transistors Q24 and Q26. The gate of the transistor Q25 receives the read control signal SC.

The transistors Q27 and Q28 are connected in series between the power supply $V_{DD}$ and the ground. The gate of the transistor Q27 is connected to the drain of the transistor Q21 and the drain of the transistor Q24. The gate of the transistor Q28 is connected to the drain of the transistor Q23 and the drain of the transistor Q26.

The output signal S4 is provided at a node N1 connected to the drains of the transistors Q27 and Q28.

Figure 3:
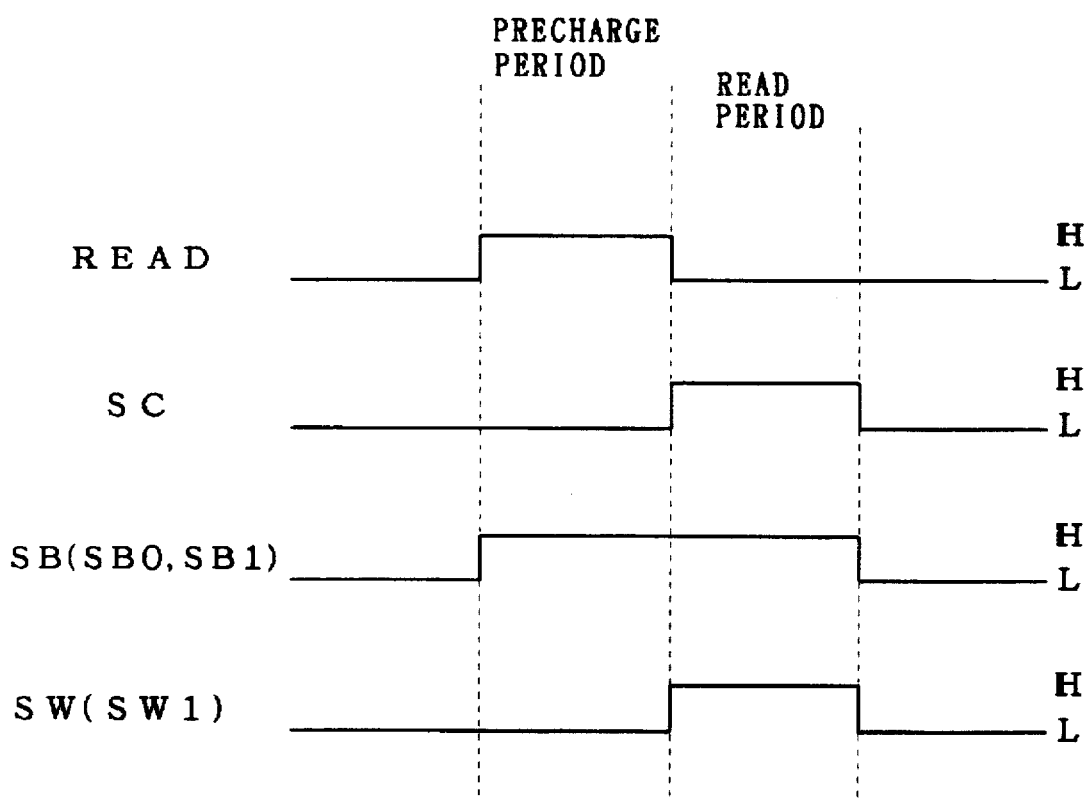
FIG. 3 is a timing chart showing the operation of the semiconductor memory device of the first preferred embodiment.

FIG. 3 is a timing chart showing the read operation of the semiconductor memory device of FIGS. 1 and 2. The operation will be described below with reference to FIG. 3. For purposes of illustration, it is assumed that the memory element 1 connected to the word line WL1 and the bit line BL1 (the shaded memory element 1' of FIGS. 1 and 2) is selected. Discussed first is the operation when the power supply voltage $V_{DD}$ is sufficiently higher than the threshold voltage VTN of the NMOS transistors Q10 to Q14.

During a precharge period in FIG. 3 (the read signal READ is "H"), some of the bit line connection/selection signals SB (SB0, SB1) change to "H" (while the signals SB2 to SB4 are "L") to turn on the N-channel MOS transistors Q10 and Q11 in the bit line selecting circuit 3, thereby selecting one bit line BL1 among the plurality of bit lines BL1 to BL4. During the precharge period, the read control signal SC is "L", turning on the PMOS transistor Q2 in the charge-up circuit 7. Then, the drain-source current of the PMOS transistor Q29 starts charging up the bit line BL1 selected by the bit line selecting circuit 3. Since the read control signal SC is "L", the output amplifying circuit 4 does not perform the output operation, and the output signal S4 is in a high impedance state.

The bit line BL1 is charged up through the N-channel MOS transistors Q10 and Q11 of the bit line selecting circuit 3. Thus, the bit line BL1 is charged up to only a potential lower than the power supply voltage $V_{DD}$ by the amount of threshold voltage VTN of the N-channel MOS transistors. However, in this preferred embodiment, the sufficiently high power supply voltage $V_{DD}$ insures the charge-up of the bit line BL1 to a potential recognizable as the logic "H".

During a read period (the read signal READ is "L"), the read control signal SC is "H" to turn off the PMOS transistor Q29, stopping the charge-up. Then, the power supply voltage $V_{DD}$ is applied to a node N2 through the normally-on type PMOS transistor Q30 to maintain the potential at the node N2.

If the data stored in the memory element 1' is "1", the memory transistor QM is in the ON position because of its low threshold voltage. As a result, the potential at the node N2 is drawn toward the ground level through the memory transistor QM of the memory element 1' to change to "L". Then, the read control signal SC changes to "H", permitting the output amplifying circuit 4 to provide its output. The presence/absence of the changes in potential at the node N2 or the presence/absence of the accumulated electric charges is converted into the output signal S4 by the output amplifying circuit 4 and utilized for output. That is, the reading of the data is completed.

Description will be given on the operation when the power supply voltage $V_{DD}$ is low and is not so high relative to the threshold voltage VTN, that is, when the voltage drop by the amount of threshold voltage VTN of the NMOS transistors of the bit line selecting circuit 3 is not negligible.

During the precharge period in FIG. 3, some of the bit line connection/selection signals SB (SB0, SB1) change to "H" (while the signals SB2 to SB4 are "L") to turn on the N-channel MOS transistors Q10 and Q11 in the bit line selecting circuit 3, thereby selecting one bit line BL1 among the plurality of bit lines BL1 to BL4.

Since the read control signal SC is "L", the bit line BL1 starts being charged up. The node N2 serving as the output of the bit line selecting circuit 3 is directly charged up by the PMOS transistor Q29 to reach substantially the power supply voltage $V_{DD}$. However, the bit line BL1 which is charged up through the N-channel MOS transistors Q10 and Q11 of the bit line selecting circuit 3 is charged to the potential lower than the power supply voltage $V_{DD}$ by the amount of threshold voltage VTN. Since the power supply voltage $V_{DD}$ is low, the potential of the bit line BL1 does not rise up to the logic "H".

During the read period in the timing chart of FIG. 3, the P-channel MOS transistor Q29 shown in FIG. 2 is in the OFF position. Since the potential at the node N2 is higher than the potential of the bit line BL1, the potential levels of the bit line BL1 and the node N2 are prone to reach a balanced potential level, and the potential at the node N2 is drawn toward the potential of the bit line BL1 to temporarily drop. Then, the memory element 1' is selected substantially simultaneously as the read control signal SC changes to "H". If the data stored in the memory element 1' is "0", the memory transistor QM is in the OFF position because of its high threshold voltage, and the potential at the node N2 rises because the node N2 receives the power supply voltage $V_{DD}$ through the PMOS transistor Q30.

If the size of the PMOS transistor Q30 is suitably designed, the potential at the node N2 does not drop to a potential which is recognized as "L" by the inverter 21 of the output amplifying circuit 4 prior to the read control signal SC goes low, but the inverter 21 outputs "0". The operation when the data stored in the memory element 1' is "1" is similar to the operation when the power supply voltage $V_{DD}$ is sufficiently high.

The size of the PMOS transistor Q29 is suitably determined by the operating rate of the circuit and the capacitance added to the bit line BL. Specifically, the PMOS transistor Q29 is preferably sized to permit such a current to flow that the potential at the node N2 completes the charge-up from "L" to "H" within the precharge period.

Figure 4:
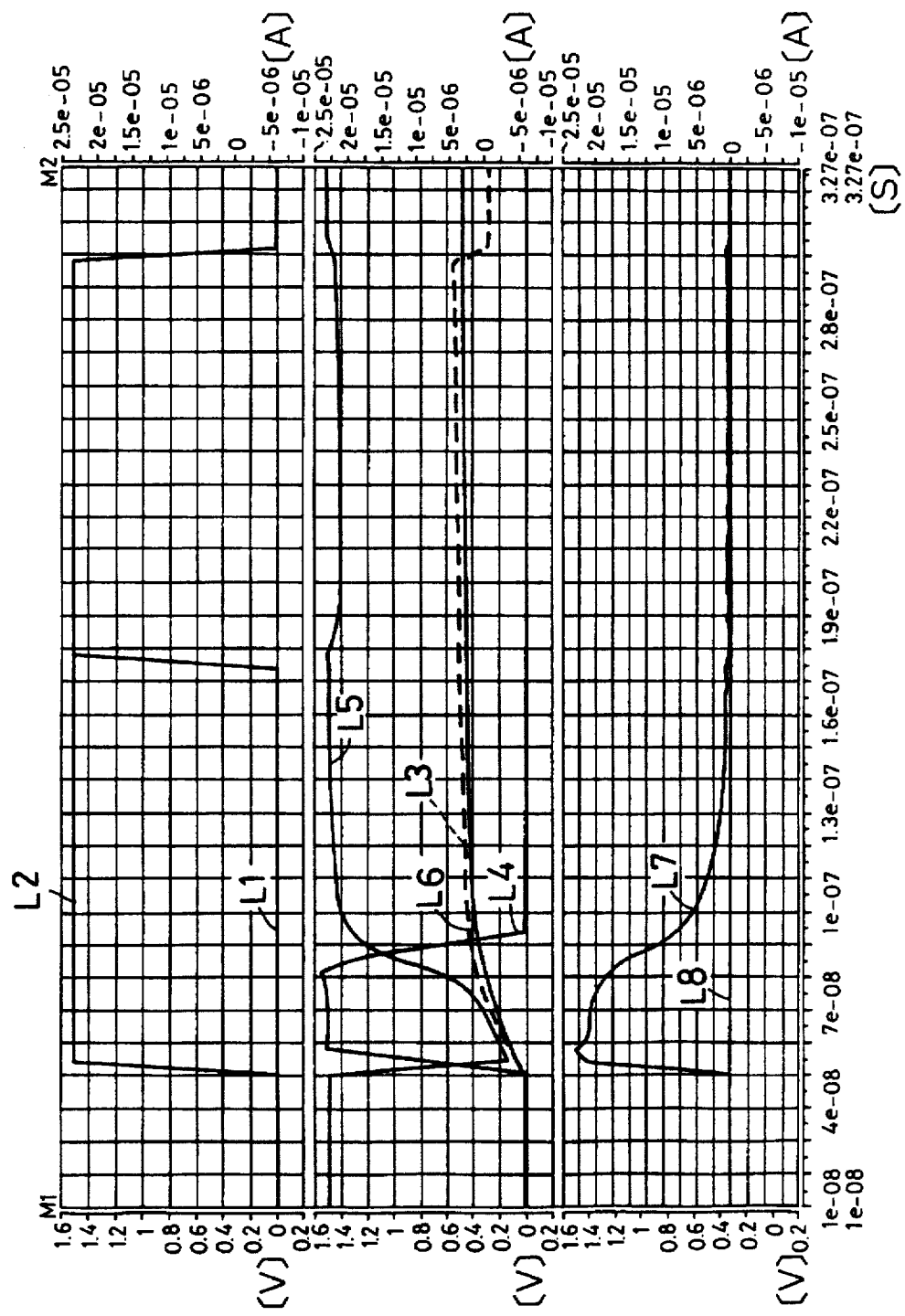
FIG. 4 is a graph showing the operation of the semiconductor memory device of the first preferred embodiment.

FIG. 4 is a graph showing the respective signal potentials changing with time in the semiconductor memory device of the first preferred embodiment. In FIG. 4, L1 denotes a change in potentials of the read control signal SC and word line selection signal SW; L2 denotes a change in potential of the bit line connection/selection signal SB with time; L3 denotes a change in potential of the selected bit line BL with time; L4 denotes a change in potential of the output signal from the inverter 21 which receives the signal at the node N2 with time; L5 denotes a change in potential at the node N2 with time; L6 denotes a change in potential at the connecting point of the source of the transistor Q10 and the drain of the transistor Q11 with time; L7 denotes a change in current flowing into the selected bit line BL through the PMOS transistor Q29 with time; and L8 denotes a change in current flowing into the memory element 1 with time. FIG. 4 shows the changes when the data stored in the selected memory element 1 is "0".

As illustrated in FIG. 4, the amount of current flowing into the selected bit line BL through the PMOS transistor Q29 at its peak is as low as about 22.5 μA.

Figure 5:
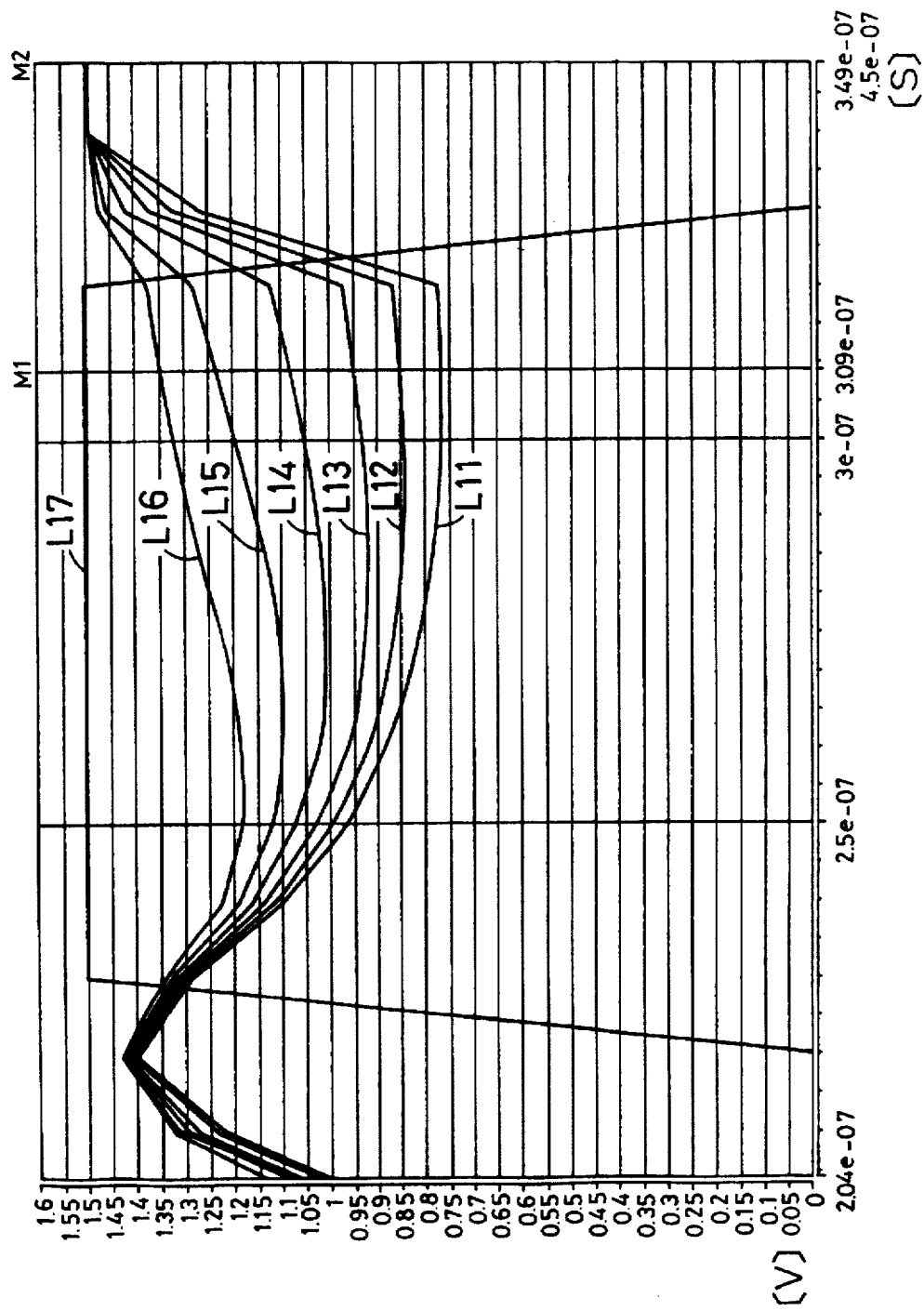
FIG. 5 is a graph showing the operation of the semiconductor memory device of the first preferred embodiment.

FIG. 5 illustrates changes in potential at the node N2 for various sizes of the PMOS transistor Q30 during the precharge period in the semiconductor memory device of the first preferred embodiment.

In FIG. 5, L11 to L16 denote changes in potential at the node N2 when the size of the PMOS transistor Q30 is increased from the minimum (L11) to the maximum (L16) in order, respectively; and L17 denotes a change in potential of the read control signal SC.

As illustrated in FIG. 5, the greater the size of the PMOS transistor Q30 is, the shorter the time required to return the potential at the node N2 to the precharge period condition when the read control signal SC changes to "H" to make a transition from the precharge period to the read period.

As above stated, the charge-up circuit 7 of the semiconductor memory device according to the first preferred embodiment selects one of the plurality of bit lines as the selected bit line to establish electrical connection between the selected bit line and the node N2 receiving the power supply voltage $V_{DD}$ which is the precharge voltage during the precharge and read periods. Thus, current flows only through the selected bit line during the precharge and read periods, accordingly permitting the operation with low power consumption.

The PMOS transistor Q30 of the charge-up circuit 7 has the source receiving the power supply voltage $V_{DD}$, the drain connected to the node N2, and the gate receiving the ground level indicative of a normally-on state. The power supply voltage $V_{DD}$ is provided from the source of the PMOS transistor Q30 during the read period. Thus, if the potential of the selected bit line does not change during the read period, the potential at the node N2 may be maintained at the power supply voltage $V_{DD}$.

The result is a stable read operation if the power supply voltage $V_{DD}$ which is the precharge voltage is relatively low.

Since the PMOS transistor Q30 is in the ON position also during the read period, the current supply capability thereof is limited so that it is not greater than the discharge capability to the ground level when the selected memory transistor QM stores "1".

Thus, the charge-up circuit 7 includes the PMOS transistor Q29 having the source receiving the power supply voltage $V_{DD}$ which is the precharge voltage, the drain connected to the node N2, and the gate receiving the control signal SC in parallel with the PMOS transistor Q30, providing the read control signal SC which is "L" during the precharge period.

Consequently, if the PMOS transistor is limited as above stated, the current supply capability of the PMOS transistor Q29 may be sufficiently increased. This insures the precharge of the selected bit line by the PMOS transistors Q29 and Q30 during the precharge period.

<Second Preferred Embodiment>

Figure 6:
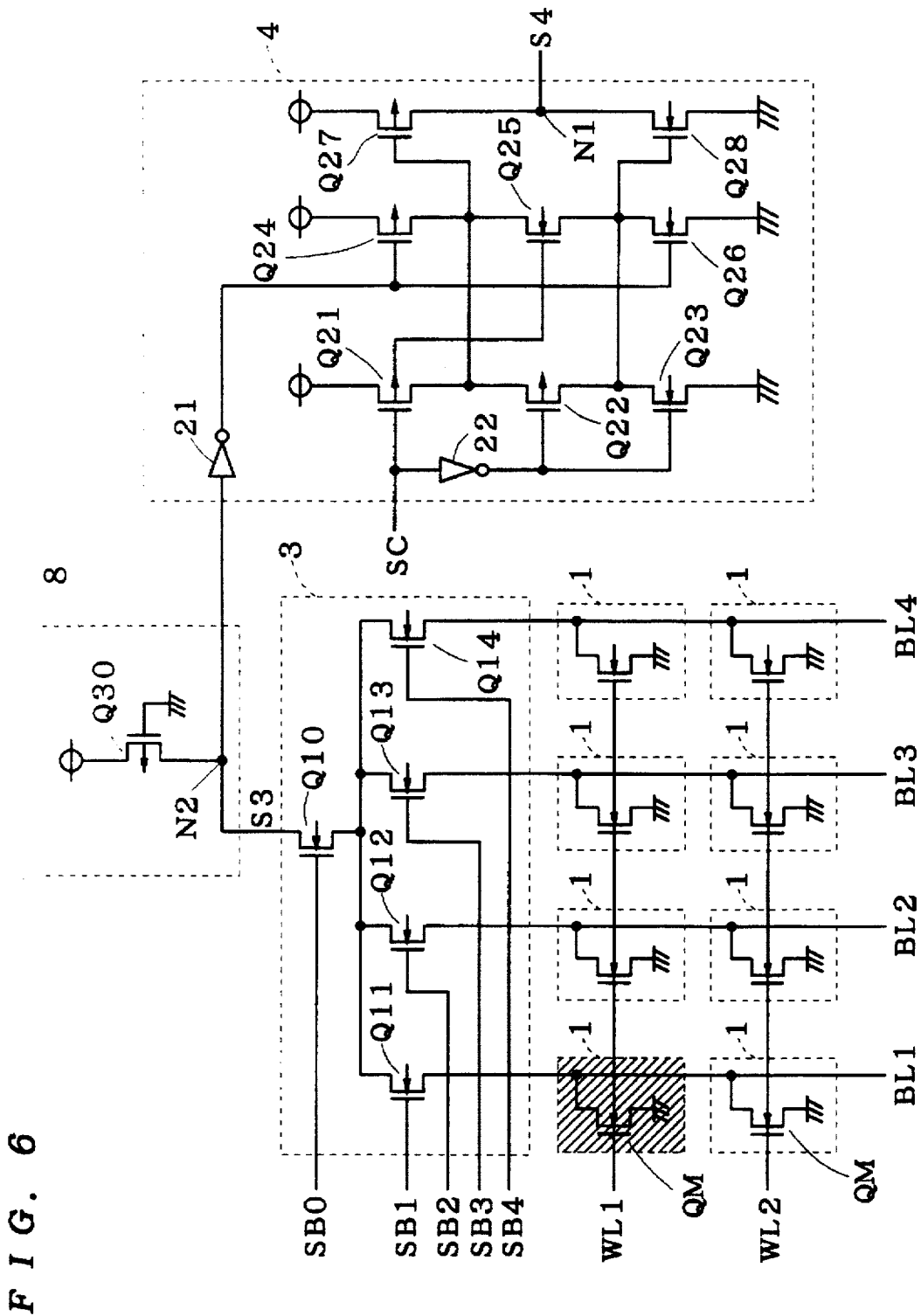
FIG. 6 is a circuit diagram of the semiconductor memory device according to a second preferred embodiment of the present invention.
Figure 7:
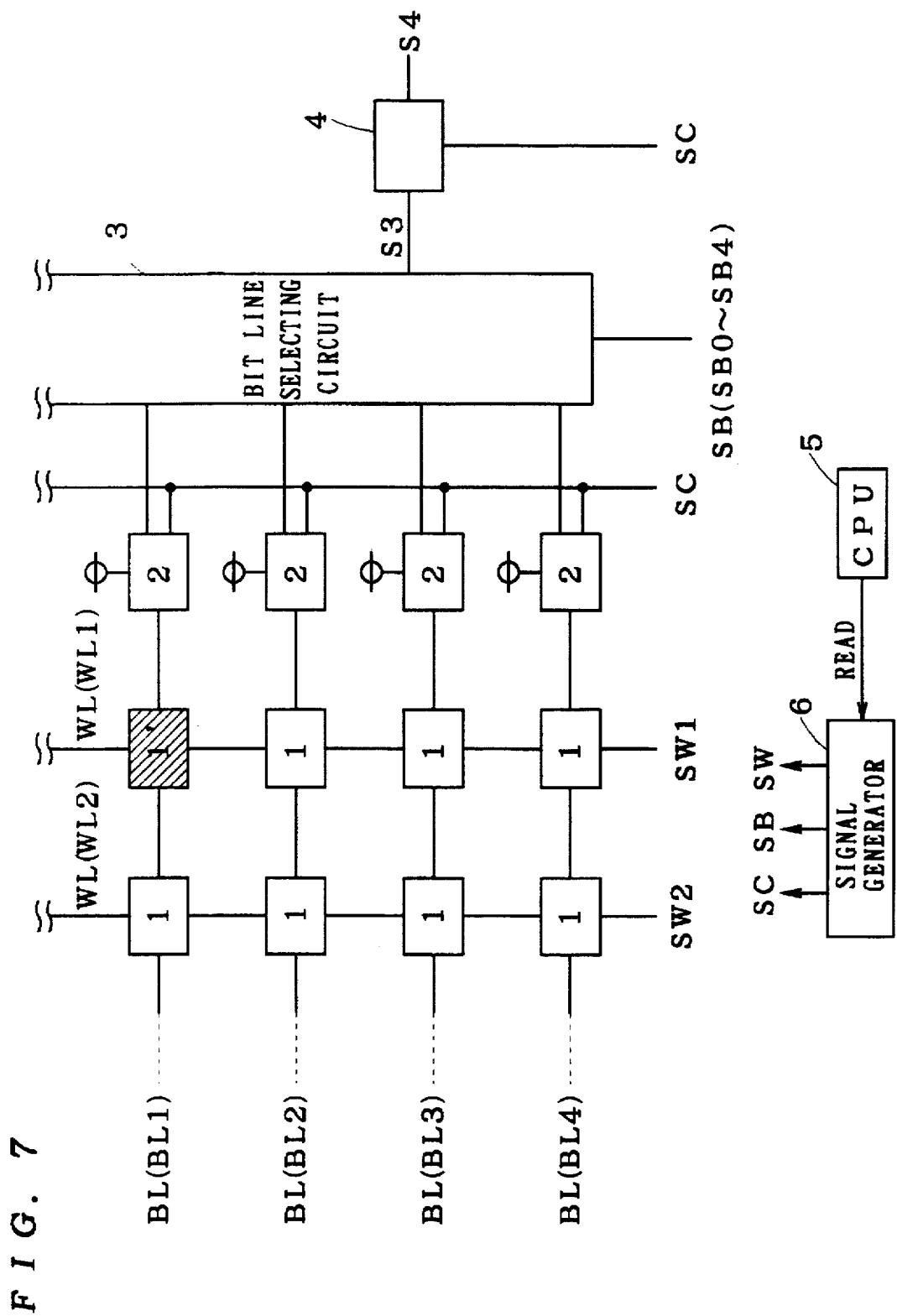
FIG. 7 illustrates the construction of a conventional semiconductor memory device.
Figure 8:
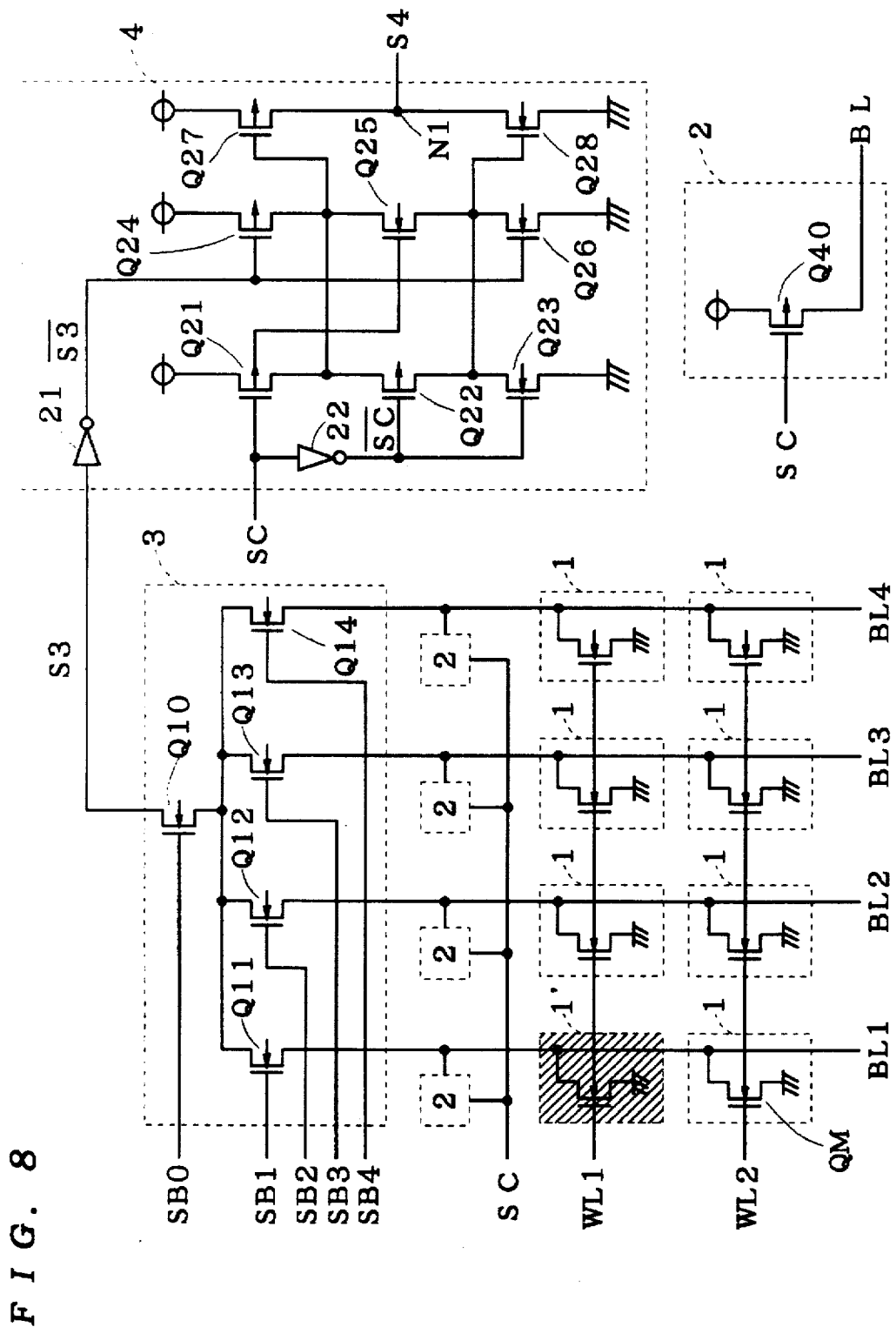
FIG. 8 is a circuit diagram showing the details of FIG. 7.
Figure 9:
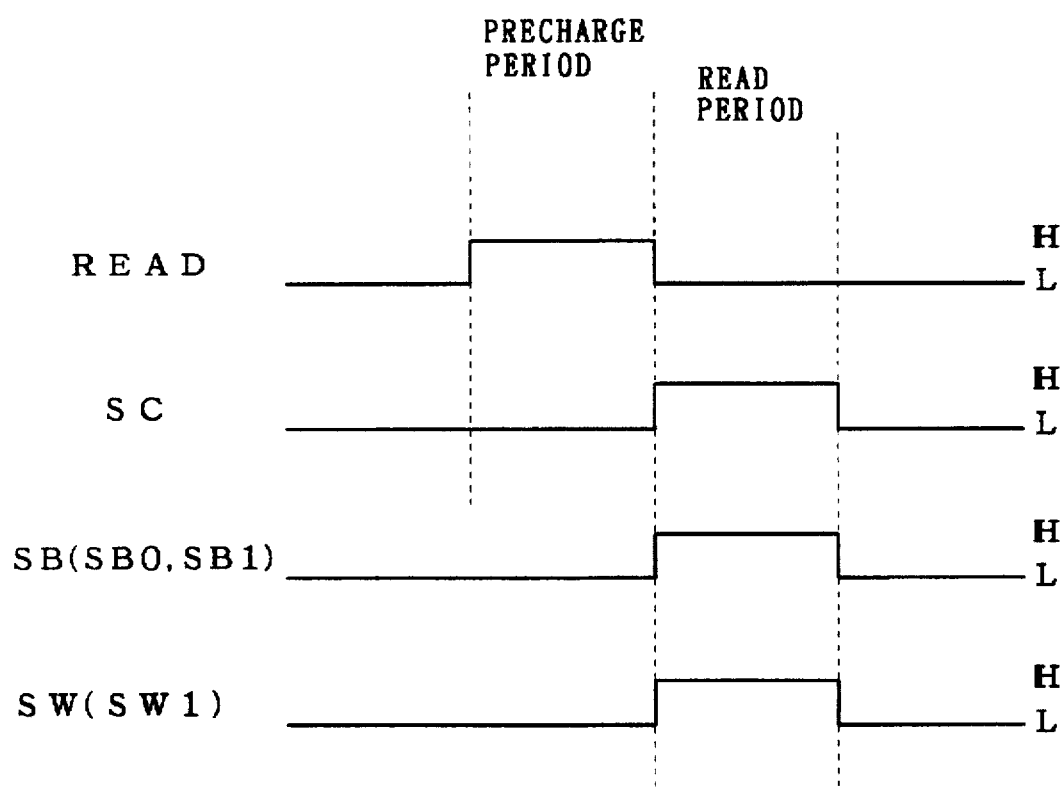
FIG. 9 is a timing chart showing the operation of the conventional semiconductor memory device.

FIG. 6 is a circuit diagram of the semiconductor memory device according to a second preferred embodiment of the present invention. As shown, a charge-up circuit 8 includes the PMOS transistor Q30 having a source connected to the power supply $V_{DD}$, a drain connected to the drain of the transistor Q10 of the bit line selecting circuit 3, and a gate fixed at the ground level. Other parts of the second preferred embodiment are similar to those of the first preferred embodiment, and the description thereof is dispensed with.

In the semiconductor memory device of the second preferred embodiment, the transistor Q30 provides the power supply voltage $V_{DD}$ to charge up the bit line BL selected by the bit line selecting circuit 3. Other parts of the read operation of the second preferred embodiment are similar to those of the first preferred embodiment.

The arrangement of the second preferred embodiment wherein the read control signal SC is not applied to the charge-up circuit 8 may be achieved by the provision of the bit line selecting circuit 3 which controls the selection of the bit line BL in response to the bit line selection signals SB1 to SB4 and which controls the connection between the charge-up circuit 8 and the selected bit line BL1 in response to the bit line connection signal SB0.

The charge-up circuit 8 of the semiconductor memory device according to the second preferred embodiment selects one of the plurality of bit lines as a selected bit line to establish electrical connection between the selected bit line and the node N2 receiving the power supply voltage $V_{DD}$ which is the precharge voltage during the precharge and read periods. Thus, current flows only through the selected bit line during the precharge and read periods, accordingly permitting the operation with low power consumption.

The PMOS transistor Q30 of the charge-up circuit 8 has the source receiving the power supply voltage $V_{DD}$, the drain connected to the node N2, and the gate receiving the ground level indicative of a normally-on state. The power supply voltage $V_{DD}$ is provided from the source of the PMOS transistor Q30 during the read period. Thus, if the potential of the selected bit line does not change during the read period, the potential at the node N2 may be sufficiently maintained at a potential close to the power supply voltage $V_{DD}$.

The result is a stable read operation if the power supply voltage $V_{DD}$ which is the precharge voltage is relatively low.

Since the PMOS transistor Q30 is in the ON position also during the read period, the current supply capability thereof is limited so that it is not greater than the discharge capability to the ground level when the selected memory transistor QM stores "1".

<Others>

The memory element 1 includes one memory transistor QM in the first preferred embodiment. The present invention, however, may be applied to any memory element which requires the precharge operation prior to the read operation. For example, the memory element may be an EPROM, an EEPROM, a RAM, a flash memory, and the like.

The present invention is not limited to the device comprised of only CMOS transistors. The device may be comprised of only PMOS transistors or only NMOS transistors.

While the invention has been described in detail, the foregoing description is in all aspects illustrative and not restrictive. It is understood that numerous other modifications and variations can be devised without departing from the scope of the invention.

We claim:

1. A semiconductor memory device comprising:
   a plurality of memory cells;
   a control signal generator providing at least a bit line selection signal and a read control voltage;
   a plurality of bit lines each connected to at least one of said plurality of memory cells;
   a bit line selecting circuit connected between said plurality of bit lines and a connection node and having an input receiving said bit line selection signal from said control signal generator for controlling the selection of one of said plurality of bit lines as a selected bit line to establish an electrical connection between said selected bit line and said connection node during at least a precharge period and a read period;
   a precharge circuit supplying a precharge voltage to said connection node;
   an output circuit providing an output signal in response to a signal at said connection node from a memory cell which occurs simultaneously with the read control voltage from the control signal generator being supplied to a control input of the output circuit; and
   wherein said precharge circuit includes at least a first transistor having a first electrode receiving said precharge voltage, a second electrode connected to said connection node, and a control electrode connected to a control terminal for receiving a fixed voltage that ensures that the first transistor is biased to be normally conductive.

2. The semiconductor memory device of claim 1,
   wherein said precharge circuit further comprises a second transistor having a first electrode receiving said precharge voltage, a second electrode connected to said connection node, and a control electrode connected to a control line receiving said read control voltage to provide a conductive sate for the second transistor as long as the read control voltage is provided on the control line by the control signal generator.

3. The semiconductor memory device of claim 2, further comprising:
   a plurality of word lines;
   wherein said plurality of memory cells are arranged in a matrix with each of said plurality of bit lines connected to a column of said plurality of memory cells and each of said plurality of word lines connected to a row of said plurality of memory cells;
   a word line selection circuit; and
   wherein said control signal generator also provides a word line selection control each of said plurality of bit lines connected to a column of said plurality of memory and bit line selection signal are being provided.

4. The semiconductor memory device of claim 3,
   wherein each of said plurality of memory cells includes a memory transistor having a first electrode connected to a corresponding one of said plurality of bit lines, a control electrode connected to a corresponding one of said plurality of word lines, and a second electrode which is grounded.

5. The semiconductor memory device of claim 4,
   wherein said memory transistor turns on/off in response to data stored therein which is "1"/"0" when the corresponding word line is at a potential indicative of a selection state.

6. The semiconductor memory device of claim 5, wherein said control signal generator further provides a bit line connection signal at the same time and for the same duration as the bit line selection signal, and wherein said bit line selecting circuit further comprises:
   a bit line connecting transistor having a first electrode connected to said connection node, a second electrode, and a control electrode receiving the bit line connection signal from the control signal generator;
   a plurality of bit line selecting transistors corresponding to said plurality of bit lines, each of said bit line selecting transistors having a first electrode connected in common to the second electrode of said bit line connecting transistor, a control electrode receiving the bit line selection signal from the control signal generator, and a second electrode connected to a corresponding one of said plurality of bit lines;
   wherein said bit line connection signal from said control signal generator has a potential and a duration which permits said bit line connecting transistor to be biased into a conducting state during said precharge period and said read period; and
   wherein said bit line selection signal from said control signal generator has a potential and a duration which permits a corresponding one of said plurality of bit line selecting transistors to be biased into a conducting state during said precharge period and said read period.

7. The semiconductor memory device of claim 6, wherein said output circuit is maintained inactive during said precharge period due to the absence of said read control voltage from the control signal generator at the control input of the output circuit.

* * * * *